United States Patent [19]

Ludikhuize

[11] Patent Number: 4,987,469
[45] Date of Patent: Jan. 22, 1991

[54] LATERAL HIGH-VOLTAGE TRANSISTOR SUITABLE FOR USE IN EMITTER FOLLOWERS

[75] Inventor: Adrianus W. Ludikhuize, Eindhoven, Netherlands

[73] Assignee: U.S. Philips Corp., New York, N.Y.

[21] Appl. No.: 262,561

[22] Filed: Oct. 25, 1988

[30] Foreign Application Priority Data

Nov. 9, 1987 [NL] Netherlands ............... 8702671

[51] Int. Cl.⁵ ............................................. H01L 29/72
[52] U.S. Cl. ................................. 357/35; 357/43; 357/48; 357/53
[58] Field of Search ................. 357/35, 43, 48, 53

[56] References Cited

U.S. PATENT DOCUMENTS 4,489,341 12/1984 Mayrand ........................ 357/35
4,807,009 2/1989 Fushimi et al. ................. 357/35

Primary Examiner—Edward J. Wojciechowicz
Attorney, Agent, or Firm—Steven R. Biren

[57] ABSTRACT

A semiconductor device includes a substrate of a first conductivity type, a semiconductor layer of the second opposite conductivity type disposed thereon and a lateral high-voltage transistor provided therein and located above a buried layer of the second conductivity type. Between the base zone and the surface-adjoining collector contact zone is situated a FET having an gate electrode separated from the semiconductor layer by a barrier layer. The gate electrode is electrically connected to the emitter. As a result, with the use of the transistor in emitter follower arrangement in the situation in which the emitter is substantially at collector potential, the emitter-collector current is not pinched off.

6 Claims, 1 Drawing Sheet

LATERAL HIGH-VOLTAGE TRANSISTOR SUITABLE FOR USE IN EMITTER FOLLOWERS

BACKGROUND OF THE INVENTION

The invention relates to a semiconductor device of the type having a semiconductor body comprising a substrate region of a first conductivity type, a semiconductor layer of the second opposite conductivity type disposed thereon and forming a pn junction with the substrate region, and a bipolar transistor having a surface-adjoining base zone of the first conductivity type, an emitter zone of the second conductivity type provided in the base zone, a highly doped buried layer of the second conductivity type present between the substrate region and the semiconductor layer and located below the base zone, a surface-adjoining collector contact zone of the second conductivity type and a gate electrode disposed between the base zone and the collector contact zone and separated by a barrier layer from the semiconductor layer.

Such a semiconductor device is described in European Patent Specification EP No. 45447.

For transistors used in circuits in which high voltages are utilized, often a construction is chosen consisting of a vertical bipolar transistor formed in a semiconductor layer and a lateral junction field effect transistor, one gate electrode of which is constituted by the substrate. The substrate is then of a conductivity type opposite to that of the semiconductor layer.

Two embodiments of this structure are described in European Patent Specification EP No. 45447.

In the first embodiment, the base zone of a vertical pnp transistor extends in projection beyond the buried layer and thus constitutes a further gate electrode of the field effect transistor, whose channel is constituted by a part of the collector region (the semiconductor layer).

If the transistor is operated so that the collector has a high voltage with respect to the emitter, the base and the substrate, the field effect transistor is depleted both from the side of the surface and from the side of the substrate. Depletion throughout the thickness of the semIconductor layer between the base zone and the substrate occurs at a voltage below the breakdown voltage (the so-called RESURF principle), as a result of which very high collector-base voltages can be used, while under the influence of the comparatively strong electric field parallel to the surface substantial emitter-collector currents can nevertheless flow.

In emitter-follower operation, the emitter, the base and the collector all have a high voltage with respect to the substrate. The semiconductor layer in this case is depleted only from the substrate, while a part of the thickness of the semiconductor layer remains undepleted so that even with a low emitter-collector voltage a sufficiently high current can flow through the semiconductor layer. A serious limitation for operation in the emitter follower configuration is the fact, however, that the outer part of the base zone may form, with the semiconductor layer and the substrate a bipolar parasitic pnp transistor. When in the case of overdrive of the npn transistor the base-collector junction is biased in the forward direction, a large hole current is injected via this pnp transistor, which is very undesirable and may lead to irreparable damage of the device. This embodiment is therefore less suitable for operation in emitter follower configuration.

According to a second embodiment described in the aforementioned European Patent Specification EP No. 45447, the buried layer extends below the entire base zone of the npn transistor and a further gate electrode of the field effect transistor is constituted by a separate P-type surface zone, which is electrically connected to the substrate. This embodiment is less suitable either for operation in emitter follower configuration. At the high voltage then prevailing at the emitter, the base and the collector with respect to the substrate, the semiconductor layer is entirely depleted from both gate electrodes (substrates and p-type surface zone). At a low emitter-collector voltage, in the absence of a sufficiently strong electric field parallel to the surface, no current can flow through the depleted part of the semiconductor layer so that the device cannot operate, appropriately.

SUMMARY OF THE INVENTION

The invention has inter alia for its object to obviate the disadvantages inherent in the devices described above or to reduce these disadvantages at least to a considerable extent and to provide a transistor for operation at high voltage which is suitable for use in an emitter follower configuration.

According to the invention, a semiconductor device of the kind described above is characterized in that the gate electrode is electrically connected to the emitter zone.

In operation in the emitter follower configuration in the semiconductor device according to the invention no depletion from the surface occurs. Moreover, in the case of overdrive of the base, i.e. with the collector-base junction in the forward direction, no or substantially no injection of charge carriers into the substrate occurs. The minority charge carriers injected by the collector-base junction are in fact collected by the gate electrode which is short circuited with the emitter, and are moreover stopped for the major part by the buried layer.

The said barrier layer may be formed, for example, by a rectifying metal-semiconductor junction (Schottky junction). However, the gate electrode is advantageously constituted by a semiconductor zone of the first conductivity type, which forms a pn junction with the semiconductor layer.

According to a further preferred embodiment, the gate electrode is constituted by an electrically conductive layer, which is separated from the semiconductor surface by an electrically insulating (barrier) layer.

A further important preferred embodiment is characterized in that a highly doped separation zone of the second conductivity type extends from the surface to the buried layer of the second conductivity type and entirely surrounds together with this layer the base zone within the semiconductor body. As a result, in the case of overdrive of the base zone, injection to the substrate is counteracted even more strongly.

It may further be recommendable to provide between the semiconductor layer and the substrate region a highly doped buried layer of the first conductivity type, which is located below the gate electrode. Consequently, the depletion from the substrate side is increased, which is desirable in given circumstances.

As already stated, the advantages of the invention are fully realized in a circuit in which the bipolar transistor is connected in emitter follower configuration.

BRIEF DESCRIPTION OF THE DRAWING

The invention will now be described more fully with reference to an embodiment and the drawing, in which.

The Figures are schematic and not drawn to scale. Corresponding parts are designated by the same reference numerals. In the cross-sections, semiconductor regions of the same conductivity type are cross-hatched in the same direction.

DESCRIPTION OF THE PREFERRED EMBODIMENTS

Figure 1:
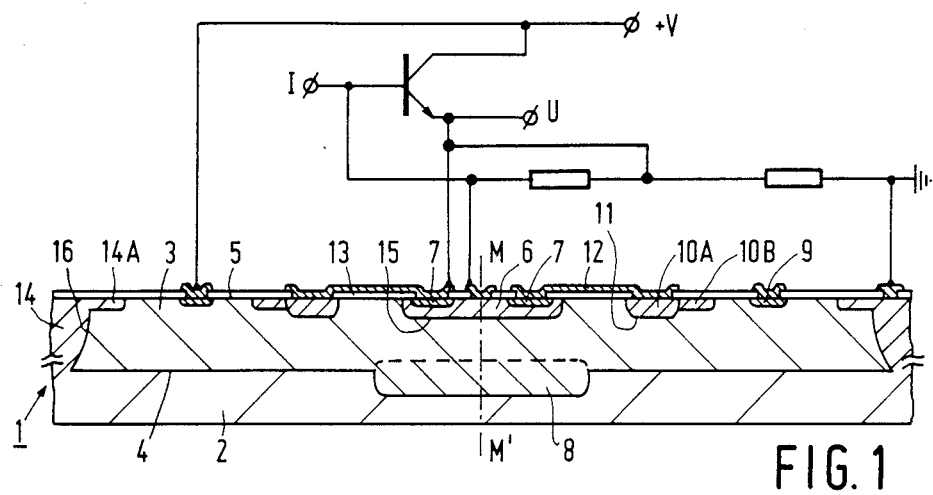
FIG. 1 shows diagrammatically in cross-section a first embodiment of a semiconductor device according to the invention.

FIG. 1 shows diagrammatically in cross-section a semiconductor device according to the invention. The device is shown for the sake of simplicity so as to be (radially) symmetrical about the line MM'; however, this is not required. The device has a semiconductor body 1 consisting in this embodiment of silicon, although other semiconductor materials may also be used. The semiconductor body 1 comprises a substrate region 2 of a first conductivity type, in this example the P-conductivity type, having a doping concentration of $3.10^{14}$ atoms/cm$^3$. A semiconductor layer 3 of the second opposite conductivity type coated with a silicon oxide layer 13 is disposed on the substrate region 2. In this embodiment, the layer 3 is an N-type conducting epitaxial layer having a thickness of about 20 μm and a doping of $6.10^{14}$ atoms/cm$^3$, which forms with the substrate region 2 a pn junction 4. An island-shaped part of the layer 3 is bounded by P-type isolation zones 14.

The device further comprises a bipolar transistor having a base zone 6 of the first (P) conductivity type adjoining the surface 5 and having a thickness of, for example, 3 μm, an emitter zone 7 of the second (N) conductivity type provided in the base zone and having a depth of 2 μm, as well as a highly doped buried layer 8 of the second (N) conductivity type disposed between the substrate region 2 and the semiconductor layer 3 and located below the base zone 6. Further, a collector contact zone 9 of the second (N) conductivity type having, for example, the same depth and doping as the emitter zone 7 adjoining the surface 5 as well as a gate electrode 10 located between the base zone 6 and the collector contact zone 9 and separated by a barrier layer 11 from the semiconductor layer 3 are present. In this embodiment, the gate electrode consists of a P type conducting zone having a more highly doped part 10A and a more weakly doped part 10B and the barrier layer is constituted by the pn junction 11, which is formed by this zone 10A, B with the N-type layer 3.

According to the invention, the gate electrode 10A, B is electrically connected to the emitter zone 7. In the present embodiment, this is effected by means of a metal layer 12, which is in contact with the highly doped part 10A of the gate electrode and with the emitter zone 7.

With the use of the transistor structure described, in emitter follower arrangement, when a comparatively high voltage is applied in the reverse direction across the pn junction 4, depletion of the layer 3 occurs from the junction 4. From the pn junction 11 between the gate electrode 10 and the N-type layer 3, no substantial depletion occurs when the emitter voltage is only small as compared with the voltage across the pn junction 4 because the zone 10 is connected to the emitter 7. Thus, with the use of the transistor (7, 6, 9) in emitter follower arrangement, in which the emitter is approximately at collector potential, the layer 3 is not fully pinched off, as a result of which current can flow also at low emitter-collector voltage.

When the emitter is approximately at substrate potential, a substantial depletion will occur, however, from the junction 11 in the region 3. The depletion regions from the pn junctions 11 and 4 must have the possibility to meet each other before breakdown occurs. In order to satisfy this condition, the product of the doping concentration of the layer 3 and of the thickness of this layer below the zone 10 must lie between approximately $0.8 \times 10^{12}$ and $1.5 \times 10^{12}$ atoms/cm$^2$.

Further, in the case the overdrive of the transistor, where the collector-base junction is connected in the forward direction, no or substantially no injection of holes takes place into the substrate 2. In fact these holes are collected by the gate electrode 10, which is short circuited with the emitter 7. Moreover, the holes that are collected are stopped by the buried layer, which has a high N-type doping with respect to the layer 3.

The transistor structure described can be manufactured by means of conventional techniques, in which the doping and the thickness of the various semiconductor layers can be chosen by a person skilled in the art in accordance with the desired properties and/or applications.

Figure 2:
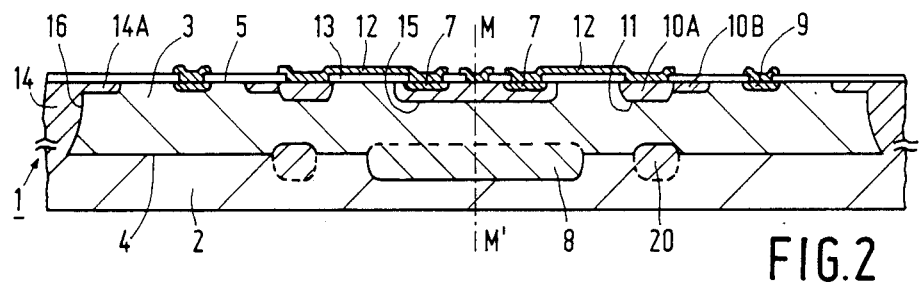
FIG. 2 shows diagrammatically in cross-section a second embodiment of a semiconductor device according to the invention.

A variation of this embodiment is shown in FIG. 2, in which a highly doped P-type buried layer 20 is provided below the gate electrode zone 10 between the semi-conductor layer 3 and the substrate region 2. As a result, the depletion of the layer 3 from the substrate side can further be increased.

Figure 3:
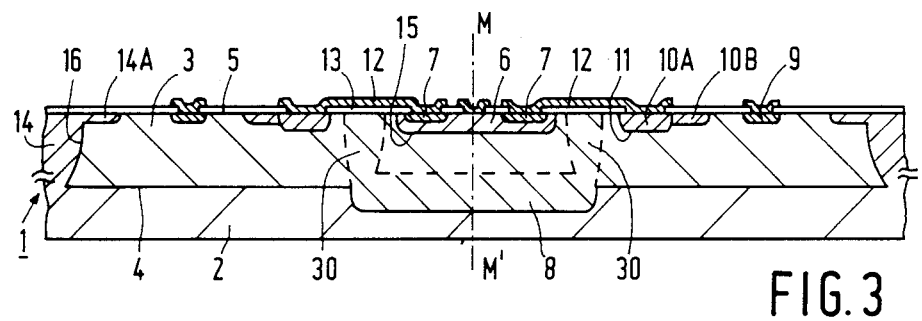
FIGS. 3 and 4 show also in cross-section two further embodiments of the semiconductor device according to the invention.

In the preferred embodiment shown in cross-section in FIG. 3, injection of charge carriers from the base zone 6 into the substrate region 2 is counteracted even more strongly. In this embodiment, a highly doped zone 30 of the same conductivity type as the buried layer 8 is further provided, which extends to the surface 5 and forms together with the buried layer 8 a highly doped zone, which entirely surrounds the base zone 6.

Figure 4:
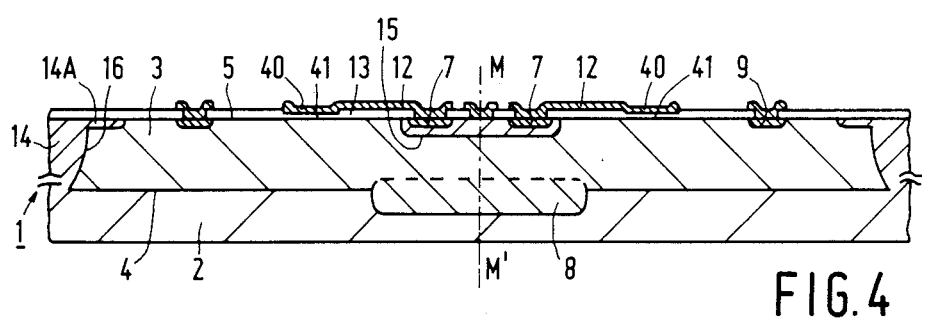

In the embodiments of the semi-conductor device according to the invention described hitherto the gate electrode is a semiconductor zone 10, which is separated by a reverse biased pn junction 11 from the semiconductor layer 5. According to a particular further preferred embodiment, the gate electrode is constituted by a conductive layer 40, which is separated by an electrically insulating layer 41 from the semiconductor surface 5 (cf. FIG. 4). Although this is not necessary, the conductive layer is constituted in this case by the same metal layer which forms also the connection layer 12. The insulating layer 41 may be a silicon oxide layer, a silicon nitride layer or another single or composite insulating layer. Thus, a metal-insulator-semiconductor structure (40, 41, 3) is formed, in which the layer 3 can be depleted from the surface 5 when a sufficiently high negative voltage with respect to the layer 3 is applied to the layer 41. Instead of metal, the material chosen for the layer 41 may also be polycrystalline silicon, a metal silicide or another conductive material. The insulating layer 41 will be chosen to be so thin that in circuits in which depletion of the layer 3 takes place from the upper side this depletion occurs sufficiently at the prevailing operating voltage.

The invention is of particular importance in circuits in which the transistor (7, 6, 9) is connected as an emitter follower (input voltage I, output voltage II), as indicated diagrammatically in FIG. 1.

In order to obtain favorable conditions for a comparatively high breakdown voltage of the associated pn junctions, shallow, more weakly doped zones (10B, 14A) ("extensions") are further added to the highly doped zones 10A and 14, these extensions being depleted at a comparatively low voltage across the pn junctions (11, 16) and reducing the field strength at the surface. The base zone 6 may also be provided with such extensions. However, none of them is essential to the present invention.

The invention is not limited to the embodiments described herein. For example, semiconductor materials other than silicon may be used; further, the conductivity types of the various semiconductor zones may also be replaced (simultaneously) by the opposite types whilst simultaneously reversing the various voltages. Furthermore, the device need not be arranged, as in the embodiments, in an island-shaped layer portion, and it need not be constructed in a radially symmetrical manner.

I claim:

1. A semiconductor device having a semiconductor body comprising a substrate region of a first conductivity type, a semiconductor layer of the second opposite conductivity type disposed thereon and forming a pn junction with the substrate region, and a bipolar transistor having a surface-adjoining base zone of the first conductivity type, an emitter zone of the second conductivity type provided in the base zone, a highly doped buried layer of the second conductivity type located between the substrate region and the semiconductor layer, a surface-adjoining collector contact zone of the second conductivity type and a gate electrode which is located between the base zone and the collector contact zone, is separated by a barrier layer from the semiconductor layer, is spaced apart from the base zone, and is electrically connected to the emitter zone, said buried layer extending laterally beneath said base zone but not extending laterally to beneath said gate electrode or said collector contact zone.

2. A semiconductor device as claimed in claim 1, characterized in that the gate electrode further comprises a semiconductor zone of the first conductivity type, which forms a pn junction with the semiconductor layer to form said barrier layer.

3. A semiconductor device as claimed in claim 1, characterized in that the gate electrode further comprises an electrically conductive layer, which is separated from the semiconductor surface by an electrically insulating layer which forms said barrier layer.

4. A semiconductor device as claimed in claim 2 or 3, characterized in that a highly doped separation zone of the second conductivity type extends from the surface to the buried layer of the second conductivity type and entirely surrounds the base zone within the semiconductor body.

5. A semiconductor device as claimed in claim 1, 2 or 3, characterized in that a further highly doped buried layer of the first conductivity type is provided between the semiconductor layer and the substrate region and is located below the gate electrode.

6. A semiconductor device as claimed in claims 1, 2 or 3, characterized in that the bipolar transistor is connected in emitter follower configuration.

* * * * *